United States Patent [19]

Blum et al.

[11] Patent Number: 5,284,734

[45] Date of Patent: * Feb. 8, 1994

[54] RADIATION-SENSITIVE MIXTURE AND USE THEREOF

[75] Inventors: Rainer Blum, Ludwigshafen; Gerd Rehmer, Beindersheim; Hans Schupp, Worms, all of Fed. Rep. of Germany

[73] Assignee: BASF Aktiengesellschaft, Ludwigshafen, Fed. Rep. of Germany

[ * ] Notice: The portion of the term of this patent subsequent to Feb. 11, 2009 has been disclaimed.

[21] Appl. No.: 412,467

[22] Filed: Sep. 26, 1989

[30] Foreign Application Priority Data

Oct. 1, 1988 [DE] Fed. Rep. of Germany ....... 3833438

[51] Int. Cl.$^5$ .............................................. G03C 1/492
[52] U.S. Cl. .................................... 430/270; 430/284; 522/46; 522/164; 525/424
[58] Field of Search ................... 430/270, 284; 522/46, 522/164; 525/424

[56] References Cited

U.S. PATENT DOCUMENTS

| | | | |
|---|---|---|---|
| 3,957,512 | 5/1976 | Kleeberg et al. | 96/35.1 |
| 4,287,294 | 9/1981 | Rubner et al. | 430/306 |
| 4,292,398 | 9/1981 | Rubner et al. | 430/306 |
| 4,311,785 | 1/1982 | Ahne et al. | 430/283 |
| 4,371,685 | 2/1983 | Ahne et al. | 430/270 |
| 4,385,165 | 5/1983 | Ahne et al. | 528/53 |
| 4,551,522 | 11/1985 | Fryd et al. | 528/351 |
| 4,558,117 | 12/1985 | Nakano et al. | 528/184 |
| 4,568,601 | 2/1986 | Araps et al. | 428/167 |
| 4,598,039 | 7/1986 | Fischer et al. | 430/323 |
| 4,608,333 | 8/1986 | Ohbayashi et al. | 430/281 |
| 4,610,947 | 9/1986 | Ahne | 430/296 |
| 4,629,777 | 12/1986 | Pfeifer | 528/353 |
| 4,654,415 | 3/1987 | Ahne et al. | 528/351 |
| 4,656,244 | 4/1987 | Ahne | 528/336 |
| 4,657,832 | 4/1987 | Pfeifer | 430/18 |
| 4,680,195 | 7/1987 | Pfeifer | 427/44 |
| 4,698,295 | 10/1987 | Pfeifer | 430/325 |
| 4,730,822 | 3/1988 | Wagner | 270/95 |
| 4,783,372 | 11/1988 | Pfeifer | 428/435 |
| 4,801,681 | 1/1989 | Ahne | 528/336 |

FOREIGN PATENT DOCUMENTS 2437369 2/1976 Fed. Rep. of Germany .

OTHER PUBLICATIONS

"Iso-", *The Naming and Indexing of Chemical Compounds by Chemical Abstracts*, vol. 46, No. 24, Dec. 25, 1952, p. 5953.

*Primary Examiner*—Marion E. McCamish
*Assistant Examiner*—Mark A. Chapman
*Attorney, Agent, or Firm*—Keil & Weinkauf

[57] ABSTRACT

Radiation-reactive mixtures suitable for producing insulating layers and printed circuits are composed of certain precursors for preparing polyimides polyisoindoloquinazolinediones, polyoxazinediones, polyquinazolinediones or polyquinazolones and aryl-containing carbonyl compounds which when excited by UV radiation are capable of hydrogen abstraction, these mixtures undergoing solubility differentiation on irradiation with actinic light.

21 Claims, No Drawings

RADIATION-SENSITIVE MIXTURE AND USE THEREOF

The present invention relates to a radiation-sensitive mixture which contains an oligomeric or polymeric precursor for a polyamide, for a polyisoindoloquinazolinedione, for a polyoxazinedione, for a polyquinazolinedione, for a polyquinazolone or for a related polyheterocycle which in the presence of suitable initiator is alterable in solubility by irradiation, preferably with UV rays, to the preparation thereof, and to the use thereof.

It is known to produce structured layers, in particular for the construction of electronic circuits, by first applying soluble, radiation-sensitive, preferably UV-sensitive, precursors (A) from solution to the is substrate and drying them under mild conditions. The dried layer is then irradiated through a mask with radiation of a suitable wavelength to form a crosslinked intermediate stage (B) structured in accordance with the mask. The non-irradiated, i.e. unexposed, areas which still contain precursor (A) are washed out with suitable solvents. The structure formed by the remaining areas is finally converted into the end function structure of stage (C) by application of high temperatures.

To prepare structures which, for example in the course of the fabrication or use of microelectronic circuits, are capable of withstanding high thermal and mechanical stresses, the preferred materials for functional stage (C) are the abovementioned heterocyclic, or aromatically heterocyclic polymers.

The soluble precursors (A) for such polymers (C) have in general a polyamide type structure such that there is adjacent to the amide group another group, in general a carboxyl, ester or ether group, which in the course of the high-temperature conversion into stage (C) will undergo a condensation reaction with the amide group.

There are two existing ways of rendering stage (A) polyamide structures radiation-crosslinkable:

1. Direct crosslinking with the polymer backbone by starting from benzophenone or benzophenone-like carbonyl compounds which will crosslink with the carbonyl group under UV light in the presence of suitable photoinitiators. Such systems are described for example in EP-A-0,134,752, EP-A-0,181,837, EP-A-0,162,017 and U.S. Pat. No. 4,568,601.

The disadvantage here is that only a few benzophenone derivatives are known for the formation of suitable polymeric precursors and even fewer are industrially available; that, in other words, the possibility of instilling certain properties of stage (C) by variation of the polymeric structure does not exist to a sufficient extent.

2. Crosslinking via side chains with olefinically unsaturated groups and the preparation of precursors suitable for this purpose as described for example in DE-A-2,437,397, DE-A-2,437,348, DE-A-2,437,413, DE-A-2,437,369, DE-A-2,919,840, DE-A-2,919,841, DE-A-2,933,826 and DE-A-2,308,830.

Precursors of the type mentioned, which are soluble in organic solvents, are described for example in DE-C-2,308,830. These polymeric precursors are polyaddition or polycondensation products of polyfunctional carbocyclic or heterocyclic compounds which carry radiation-sensitive radicals with dismines, diisocyanates, bisacid-chlorides or dicarboxylic acids. The compounds which carry radiation-sensitive radicals contain two carboxyl, chlorocarbonyl, amino, isocyanate or hydroxyl groups suitable for addition or condensation reactions and, partly in ortho or para position to the first groups, ethylenically unsaturated groups bonded in ester fashion to carboxyl groups. The dismines, diisocyanates, bisacid chlorides and dicarboxylic acids to be reacted with these compounds have at least one cyclic structural element.

Radiation-reactive polyamide precursors specifically are prepared by adding unsaturated alcohols, such as allyl alcohol, to tetracarboxylic dianhydrides, such as pyromellitic dianhydride, converting the free carboxyl groups of the resulting diesters into acid chloride groups, and subjecting the resulting diester bisacid chlorides to a polycondensation reaction with a dismine, which is usually aromatic, such as diaminodiphenyl ether. If diamino compounds having ortho-disposed amido groups are used, polyisoindoloquinazolinediones are formed in a similar manner.

Polyoxazinedione precursors are formed by polyaddition of diisocyanates, such as diphenylmethane diisocyanate to phenolic hydroxyl groups of olefinically unsaturated diesters, such as methylene disalicylic esters, and, similarly, polyquinazolinediones are formed by polyaddition of diisocyanates to amino groups of olefinically unsaturated diesters.

Existing methods of preparation generally involve multiple reaction stages and require low temperatures. In addition, if acid chlorides are used, thorough purification of the reaction products is necessary; that is, the synthesis of unsaturated diesters of the type mentioned is difficult to carry out.

DE-A-2,933,826 indicates a way of circumventing some of these difficulties by adding unsaturated epoxides to carboxyl-containing precursors. The disadvantage here is that carboxyl groups react with epoxy groups at a satisfactory rate only at elevated temperature and in the presence of catalysts. As a consequence, the products formed are frequently insoluble, for example as a result of partial imidation, or incipiently crosslinked.

The disadvantages of this method are thus the difficulties in the formation of stages (A) due to the unsaturated character of the starting materials and the end products.

For instance, only relatively low temperatures may be used, which results in long reduction times and poor conversions. Furthermore, it is nonetheless necessary in some instances to add polymerization inhibitors, which must later be removed in complicated purification operations in order to obtain a high light sensitivity, or speed, in use.

Another disadvantage becomes evident in storing and processing the unsaturated stages (A), which because of the dangers of oxidation and polymerization must take place under inert gas and with cooling.

It is an object of the present invention to provide an oligomeric or polymeric precursor for a polyamide, for a polyisoindoloquinazolinedione, for a polyoxazinedione, for a polyquinazolinedione, for a polyquinazolone or for a related polyheterocycle, which is soluble in an organic solvent, which is radiation-reactive, which is easy to prepare and which is storable and processible without special precautions such as inert gas and cooling.

We have found, surprisingly, that this object is achieved by introducing an easily abstractable hydrogen into the polymer main chain of precursor (A) and by using a certain carbonyl compound.

The present invention accordingly provides a radiation-sensitive mixture which is suitable for preparing a polyimide, a polyisoindoloquinazolinedione, a polyoxazinedione, a polyquinazolinedione or a polyquinazolone and which on irradiation with actinic light undergoes solubility differentiation, consisting of (a) one or more precursors having structural elements of the general formula (I)

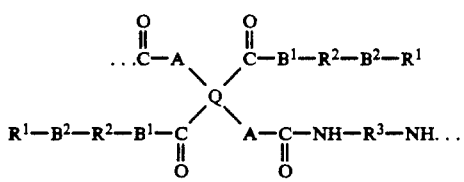

where
A is —O—, —NH— or a single bond,
Q is an unsubstituted or halogen-substituted aromatic or heterocyclic tetravalent radical, or a radical which contains two bivalent aromatic radicals linked by a bridging group, wherein two at a time of the valences are adjacent to each other,
$B^1$ is —O— or —$NR^4$—,
$B^2$ is —NH—CO—NH—, —NH—CO—O—, —NH—CO— or a single bond,
$R^1$ is H, alkyl, aryl, an ethylenically unsaturated radical or a readily hydrogen-donating radical selected from the group consisting of isoalkyls, aminoisoalkyls, cycloisoalkyls, cycloisoalkyls having one or more heteroatoms, isoalkylaryls and groups of the following general formulae:

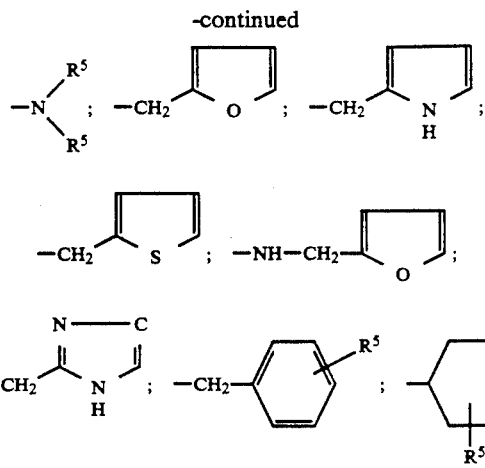

where
n is 2 or 3,
$R^2$ is a bivalent aliphatic or aromatic radical or a single bond,
$R^3$ is a bivalent aliphatic, cycloaliphatic, aromatic or heterocyclic radical which may be halogen-substituted,
$R^4$ is H or straight-chain or branched alkyl which may be halogen-substituted, and
$R^6$ is alkyl, aryl, halogen-substituted alkyl or halogen- or otherwise-substituted aryl,
with the proviso that at least one of Q and $R^3$ has a readily abstractable hydrogen atom, (b) one or more aryl-containing carbonyl compounds which when excited by UV radiation are capable of hydrogen abstraction, and optionally (c) one or more substances selected from the group consisting of a photoinitiator, a photosensitizer, a (leuco)dye and an aliphatic ketone.

Q thus is an unsubstituted or halogen-substituted at least partly aromatic and/or heterocyclic tetravalent radical wherein two valences at a time are adjacent to each other. If Q has a plurality of aromatic and/or heterocyclic structure elements, the valence pairs are each located on terminal structural elements of this type.

Q and/or $R^3$ have at least one readily abstractable hydrogen atom in the main chain.

$R^1$ and/or $R^2$ and/or $R^3$ and/or Q may possess further readily abstractable hydrogen atoms bonded directly to the molecule or alternatively via linking members, for example ester, ether, amide, amino or urethane groups.

A suitable aryl-containing carbonyl compound (b) is selectable in particular from the group consisting of benzophenone, xanthone, thioxanthone, fluorenone, benzil, acenaphthenequinone, tetralone, benzylideneacetone, dibenzylideneacetophenone, benzoin, benzoin ether, benzanilide, acetophenone, propiophenone, naphthoquinone, anthraquinone, anthrone and the carbonyl compounds derived from these basic structures, for example by halogenation or alkylation.

Similarly, the carbonyl compound (b) can be benzophenone or benzophenone derivative, alone or mixed with 2-, 3- or 4-hydroxybenzophenone, benzophenone-2-carboxylic acid, benzophenone-3-carboxylic acid, benzophenone-4-carboxylic acid, 3,3',4,4'-benzophenonetetracarboxylic acid or anhydride, 3,3',4,4'-tetra(tert.butylperoxycarbonyl)benzophenone, 2-, 3- or 4-phenylbenzophenone, 2-, 3- or 4-alkylbenzophenones having from 1 to 10 carbon atoms in the alkyl radical or halogenated (monoalkyl)benzophenones, such as 4-(trifluoromethyl) benzophenone, and also heteroceriumdianthrone and its endoperoxide, or ketones such as 2-acetonaphthone, 4-aminobenzophenone, 4,4'-tetramethylaminobenzophenone and the salts of these amines and optionally also aliphatic ketones such as acetone, methylisobutyl ketone or isoamyl ketone and copolymers of carbon monoxide with ethylene alone or combined with the abovementioned carbonyl compounds.

The radiation-sensitive mixture according to the invention contains a carbonyl compound (b) in general in an amount of from 0.001 to 200, preferably from 1 to 20, % by weight, based on precursor (a).

In the radiation-sensitive mixture according to the invention, the carbonyl compound (b) can be used in a solid, dissolved, dispersed or molten, monomeric or polymeric form; furthermore, to improve the speed and to match the absorption to a source of UV rays, a noncarbonylic photoinitiator and/or certain dyes may additionally be added.

To form the precursor (a), which may be used in a monomeric, oligomeric or polymeric form or in the form of a mixture of different polymerization stages, carboxyl-containing polyaddition products of aromatic and/or heterocyclic tetracarboxylic anhydrides and diamino compounds may be linked at the carboxyl groups to radicals $R^1$ via an ester, ether, amide or urethane group or carboxyl-containing polyaddition products of aromatic and/or heterocyclic dihydroxydicarboxylic acids and diisocyanates may be linked at the carboxyl groups to radicals $R^1$ via an ester, ether, amide or urethane group, or carboxyl-containing polyaddition products of aromatic and/or heterocyclic diaminodicarboxylic acids and diisocyanates may be linked at the carboxyl groups to radicals $R^1$ via an ester, ether, amide or urethane group.

The present invention also provides a process for preparing a radiation-sensitive mixture according to the invention, which comprises introducing a radical $R^1$ into a precursor (a) by reacting a carboxyl-containing polyaddition product of an aromatic or heterocyclic diaminodicarboxylic acid and a diisocyanate, or a carboxylcontaining polyaddition product of an aromatic or heterocyclic dihydroxydicarboxylic acid and diisocyanate, or a carboxyl-containing polyaddition product of an aromatic or heterocyclic tetracarboxylic anhydride and a diamino compound with a mono adduct of a diisocyanate and a compound of the structure $R^1$—OH, $R^1$—$NH_2$, $R^1$—$(B^2)$—$NH_2$ or $R^1$—COOH.

In a preferred way of preparing a precursor (a), a radical $R^1$ is introduced into the carboxyl-containing polyaddition product of an aromatic or heterocyclic diaminodicarboxylic acid and diisocyanate or into the carboxyl-containing polyaddition product of an aromatic or heterocyclic dihydroxydicarboxylic acid and diisocyanate or into the carboxyl-containing polyaddition product of an aromatic or heterocyclic tetracarboxylic anhydride and diamino compound in such an amount that the ratio of $R^1$ to carboxyl in the carboxyl-containing polyaddition product is from 1:1 to 0.05 to 1.

In this reaction, the preferred tetracarboxylic anhydride is pyromellitic anhydride or benzophenonetetracarboxylic anhydride, the preferred dihydroxydicarboxylic acid is 4,4'-dihydroxydiphenylmethane-3,3'-dicarboxylic acid and the preferred diaminodicarboxylic acid is 4,4'-diaminodiphenylmethane-3,3'-dicarboxylic acid.

The radiation-sensitive mixture according to the invention may in addition to the groups present therein, which are crosslinkable via $R^1$, contain further radiation-sensitive radicals, in particular radicals having ethylenic double bonds and/or other radicals which crosslink with bioazides.

The radiation-sensitive mixture according to the invention may also be used mixed with other radiation-sensitive substances and/or non-radiation-sensitive substances.

The present invention also provides a method of using the radiation-sensitive mixture according to the invention for producing protective and insulating layers for use in the construction of printed and integrated circuits by subjecting it to radiative crosslinking and/or thermal aftertreatment, or by exposing it through a mask and thereby partially crosslinking it, then structuring it with suitable solvents and then if necessary subjecting it to a thermal aftertreatment.

The present invention additionally provides a method of using the radiation-sensitive mixture according to the invention for producing paints, coatings, embedding materials or protective overcoats on optical fibers.

The precursor (a) according to the invention is soluble in organic, in particular polar, solvents such as formamide, acetamide, N-methylformamide, N,N-dimethylformamide, N-methylpyrrolidone, N,N-dimethylacetamide, butyrolactone, caprolactam, hexamethylphosphoramide or mixtures thereof, easy to prepare and storable and processible without special precautions and without loss of radiation reactivity.

The radiation-sensitive mixture according to the invention, i.e. the mixture of one or more precursors (a) with the abovementioned carbonyl compounds (b) which when excited by UV radiation are capable of hydrogen abstraction, is notable in particular for low weight losses in the formation of the end function structures (C) and hence good formation of structures on use in microelectronics.

There now follow specifics concerning the formative components of the precursor (a) to be used according to the invention and the radiation-sensitive mixture.

The precursor (a) according to the invention preferably contains or consists of groups of the general formula (I)

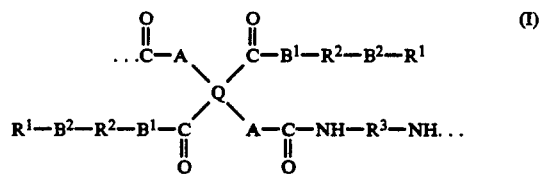

where
A is —O—, —NH— or a single bond,
Q is an unsubstituted or halogen-substituted aromatic or heterocyclic tetravalent, i.e. tetrafunctional radical wherein two valences at a time are adjacent to each other, or is a radical which contains two bivalent aromatic radicals bonded to each other via a bridging group Y (cf. below), i.e. in total a tetravalent radical wherein two valences at a time are adjacent to each other; if the radical Q has a plurality of aromatic and/or heterocyclic structural elements, the valence pairs are each located on terminal structural elements of this type which have at least one readily abstractable hydrogen atom, unless it is present in $R^3$, e.g. 4,4'-isopropylidenediphthalic acid, dicarboxydihydroxydiphenylisopropylidene, tetrahydrofurantetracarboxylic acid, mercaptoanthracenetetracarboxylic acid, 9,10-dimercaptoanthracenedicarboxylic acid or diisopropyldicarboxydiphenylmethane.

$B^1$ is —O— or —$NR^4$—, $B^2$ is —NH—CO—NH—, —NH—CO—O—, —NH—CO— or a single bond, $R^2$ is a bivalent aliphatic or aromatic radical or a single bond, $R^2$ may also contain a readily abstractable hydrogen atom;

$R^3$ is a bivalent aliphatic, cycloaliphatic, aromatic or heterocyclic radical, which may also be halogen-substituted and is preferably derived from diamines and diisocyanates which will be described hereinafter in more detail, or a single bond, $R^3$ may contain an easily abstractable hydrogen atom; it must contain an easily abstractable hydrogen atom if Q does not contain an easily abbtractable hydrogen atom;

$R^1$ is H, alkyl of from 1 to 10 carbon atoms, e.g. isopropyl, aryl, e.g. cumyl, benzyl, an ethylenically unsaturated radical, e.g. allyl, acryloyl, methacryloyl or a readily hydrogen-donating radical from the group consisting of isoalkyls of from 3 to 12 carbon atoms, e.g. isopropyl, isobutyl or ethylhexyl, aminoisoalkyls of from 3 to 12 carbon atoms, e.g. diisopropylaminoethyl, isopropylaminoalkyl, N-isobutylisopropylaminoalkyl, cycloisoalkyls of from 5 to 8 carbon atoms, e.g. methylcyclohexyl or isopropylcyclohexyl, cycloisoalkyl which contains one or more hetero atoms, e.g. furfuryl, tetrahydrofurfuryl, p-menthyl, terpinyl or thymolyl, and groups of the following formulae:

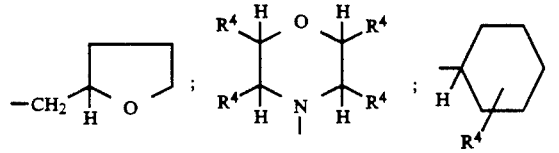

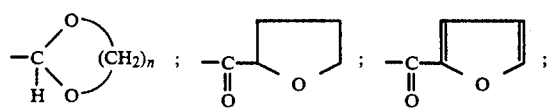

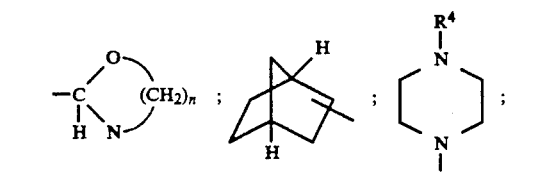

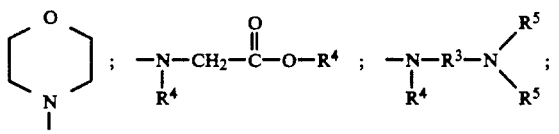

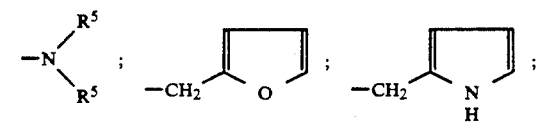

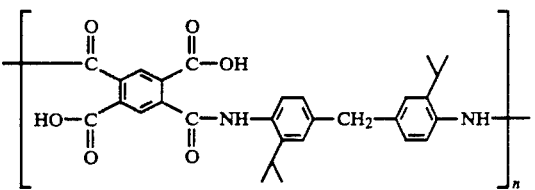

where n is 2 or 3 and $R^4$ is H, straight-chain or branched alkyl of from 1 to 15 carbon atoms, halogen-substituted, e.g. Cl—, F— or Br-substituted, straight-chain or branched alkyl of from 1 to 15 carbon atoms, e.g. —C—(CF$_3$) or isopropyl, $R^5$ is alkyl of from 1 to 15 carbon atoms, e.g. isopropyl, isobutyl or isoamyl, aryl, e.g. isoamylphenyl, halogen-substituted, e.g. F—, Cl— or Br-substituted alkyl, of from 1 to 15 carbon atoms, halogen-substituted, e.g. F—, Cl— or Br-substituted, aryl.

Examples of a precursor (a) of the general formula (I) are:

Formula (I/1)

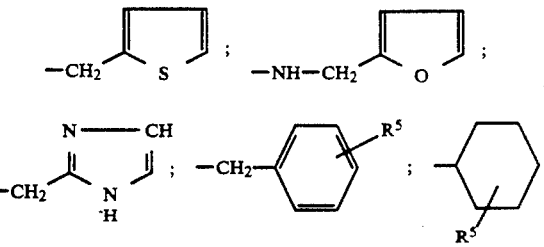

Q: Pyromellitic acid radical, $R^3$: /4,4'-Diamino(3,3'-diisopropyl)bisphenyl/methane radical having abstractable hydrogen atoms, $B^1$: —O—, $R^2$: Single bond, $B^2$: Single bond, $R^1$: H, A: Single bond, n: from 2 to about 200

Formula (I/2)

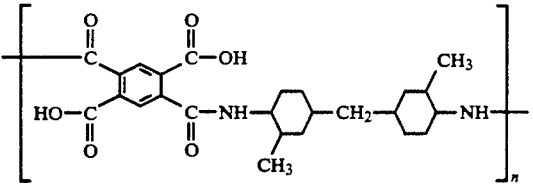

Q: Pyromellitic acid radical, $R^3$: [4,4'-Diamino(3,3'-dimethyl) biscyclohexyl]methane radical having readily abstractable hydrogen atoms according to the invention, $B^1$: —O—, $R^2$: Single bond, $B^2$: Single bond, R¹: H,
A: Single bond,
n: from 2 to about 200

B²: Single bond,
R¹: H,
A: Single bond,,

Formula (I/3)

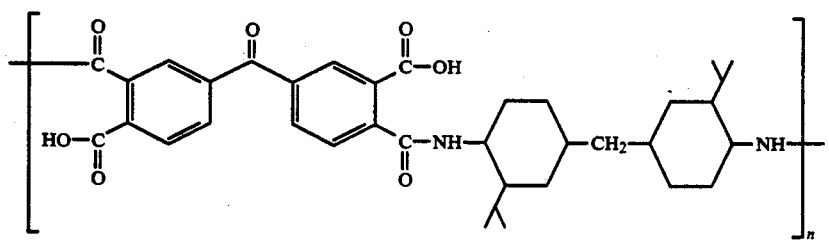

Q: Benzophenonetetracarboxylic acid radical,
R³: [4,4'-Diamino (3,3'-diisopropyl) biscyclohexyl]methane radical having readily abstractable hydrogen atoms, n: from 2 to about 200
Precursors (a) of the formulae (I/1) to (I/4) lead on treatment at higher temperatures, in general >150° C., to polyamides as substances of stage (C).

Formula (I/5)

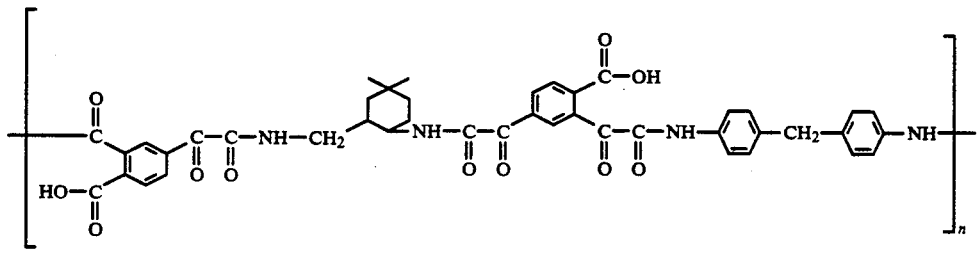

B¹: —O—,
R²: Single bond,
B²: Single bond,
R¹: H,
A: Single bond,
n: from 2 to about 200

Q: Trimellitic acid/isophorone diisocyanate reaction product which carries readily abstractable hydrogen atoms,
R³: Diisocyanatodiphenylmethane radical,
B¹: Single bond,
R²: Single bond, Formula (I/4)

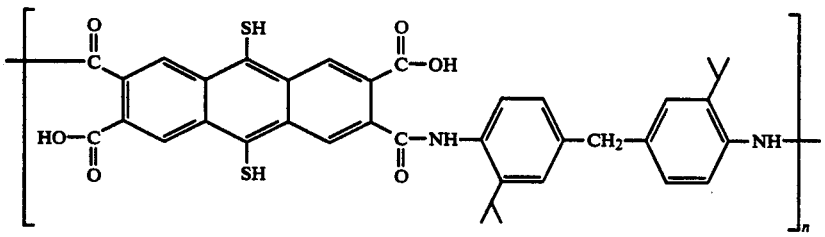

Q: 9,10-Dimercaptoanthracenetetracarboxylic acid radical which carries readily abstractable hydrogen atoms,
R³: Diaminodiphenylmethane radical,
B¹: —O—,
B²: Single bond, B²: Single bond,
R¹: H,
A: Single bond,
n: from 2 to about 200
Precursors (a) of the formula (I/5) lead on treatment at high temperatures, in general ≧150° C., to polyamides as substances of stage (C).

Formula (I/6)

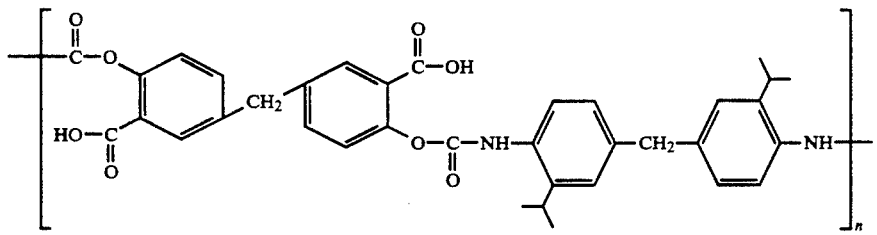

Q: 3,3'-Dicarboxyl-4,4'-dihydroxydiphenylmethane radical,
R³: 4,4'-Diisocyanato(3,3'-diisopropyl)diphenylmethane radical which carries readily abstractable hydrogen atoms according to the invention,
B¹: Single bond,
R²: Single bond,
B²: Single bond,
R¹: H,,
A: —O—,
n: from 2 to about 200

Precursors (a) of the formula (I/6) form on treatment at higher temperatures, in general ≧150° C., polybenzoxazinediones as substances of stage (C).

The tetravalent radical Q in the general formula (I) may be for example one of the following radials without wishing to restrict the claimed structures to those having these structural elements:

Q = 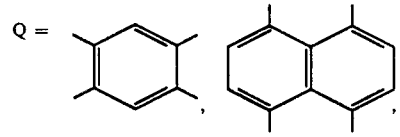

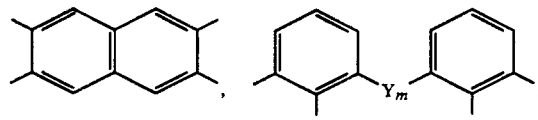

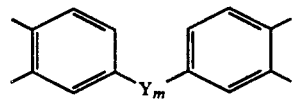

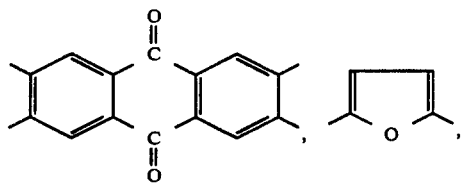

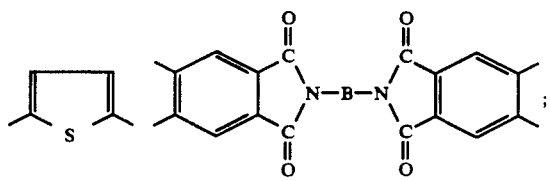

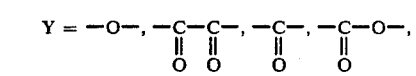

where

Y = —O—, —C—C—, —C—, —C—O—,
         ‖ ‖    ‖    ‖
         O O    O    O

—C—NH—, —S—, —SO—, —SO₂—, —CH₂—,
‖
O

—N=N—, —N—C—N—, —SO₂—NH—, —NH—,
       H ‖ H
         O

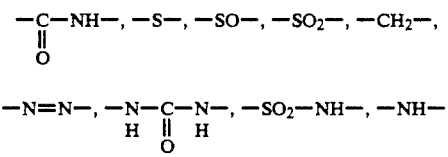

m = 0 or 1;
(Iso)Alkyl = n-alkyl of from 1 to 10 carbon atoms or isoalkyl of from 3 to 12 carbon atoms,

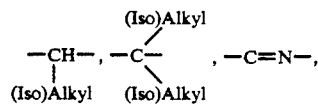

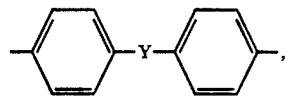

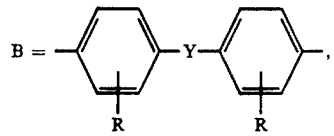

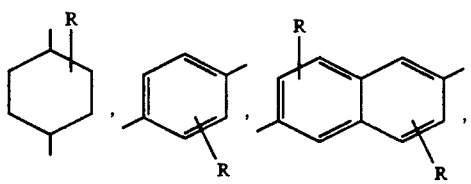

R = alkyl of from 1 to 10 carbon atoms, isoalkyl of from 1 to 10 carbon atoms, halogen or H.

Prior art precursors are obtained by incorporating into these double bonds, groups which are radiation-crosslinkable via bisazides, or benzophenone groups, and using these products in the presence of suitable photoinitiators.

Basically, there are two ways for forming the prior art precursors (a):

1. Introduction of the light-sensitive group into the monomer units, followed by synthesis of the higher molecular weight precursors.

A typical example of this way is indicated in DE-2,437,397, namely addition of allyl alcohol to pyromellitic anhydride, reaction of the monoester formed with thionyl chloride to give the acid chloride, and polymerization thereof with dismines.

Further prior art documents which describe methods of synthesis starting from unsaturated monomeric units are for example DE-A-2,437,369, DE-A-2,437,413, DE-A-2,919,840, DE-A-2,919,841, DE-A-3,411,660, DE-A-3,411,697, DE-A-3,411,706, DE-A-3,411,714, U.S. Pat. No. 4,551,522 and U.S. Pat. No. 4,558,117.

2. Another way of introducing light-sensitive unsaturated groups consists of first forming polymeric or oligomeric products without light-sensitive groups and then introducing light-sensitive groups into them.

A typical example of this way is described for example in DE-A-2,933,826: pyromellitic anhydride and diaminodiphenyl oxide are added together in dimethylacetamide as solvent to form a polyamide which contains carboxyl groups. These carboxyl groups are then reacted with glycidyl methacrylate to introduce double bonds, thereby forming preliminary products which are UV-crosslinkable in the presence of photoinitiators.

Further prior art documents which describe the subsequent introduction of light-sensitive groups into polymeric preliminary products are for example DE-A-2,933,827 and DE-A-3,021,748.

According to the invention, polymeric and/or oligomeric precursors (a) for polyamides, polyisoindoloquinazolinediones, polyoxazinediones, polyquinazolinediones and related polyheterocycles are made accessible to radiative crosslinking by constructing them from building blocks which possess readily abstractable hydrogen atoms and by then using them in combination with carbonyl compounds (b), i.e. carbonyl compounds which when excited by light, preferably UV light, are capable of hydrogen abstraction.

Suitable precursors (a) for the purposes of the present invention carry directly on the polymer backbone structural members which possess easily abstractable hydrogen atoms, e.g. isoalkyl, such as isopropyl, isobutyl, ethylhexyl or methylcyclohexyl, aminoisoalkyl, such as diisopropylaminomethyl, isopropylaminoalkyl, N-isobutylisopropylaminoalkyl, furfuryl, tetrahydrofurfuryl, benzyl, cumyl, p-menthyl, terpinyl or thymolyl.

These radicals may also be further substituted, in particular by alkyl and/or halogen.

Carbonyl compounds (b) are preferably aromatic ketones, such as benzophenone, xanthone, thioxanthone, fluorenone, benzyl, acenaphthenequinone, tetralone, benzylideneacetone, dibenzylideneacetone, benzoin, benzoin ethers, naphthoquinone, anthraquinone, anthrone and the carbonyl compounds derived from these basic structures, for example by halogenation or alkylation, and also aromatic/aliphatic ketones such as acetophenone and propiophenone.

Particular preference is given to benzophenone and benzophenone derivatives, alone or mixed, e.g. 2-, 3- or 4-hydroxybenzophenone, benzophenone-2-carboxylic acid, benzophenone-3-carboxylic acid, benzophenone-4-carboxylic acid, 3,3',4,4'-benzophenonetetracarboxylic acid and anhydride, 3,3',4,4'-tetra(tert.-butylperoxycarbonyl)benzophenone, 2-, 3- or 4-phenylbenzophenone, 2-, 3- or 4-alkylbenzophenones having from 1 to 10 carbon atoms in the alkyl radical, halogenated (monoalkyl)benzophenones, such as 4-(trifluoromethyl)benzophenone. It is also possible to use heteroceriumdianthrone and its endoperoxide. Further possibilities are ketones such as 2-acetonaphthone, 4-aminobenzophenone and 4,4'-tetramethylaminobenzophenone and the salts of these amities. It is also possible to use aliphatic ketones such as acetone, methyl isobutyl ketone, isoamyl ketone and copolymers of carbon monoxide with ethylene.

Mixtures of carbonyl compounds can also be used with advantage.

The carbonyl compound (b) is particularly used in amounts of from 0.001 to 90%, preferably from 1 to 10%, based on the precursor (a). The carbonyl compounds can be used in a solid, dissolved, dispersed or molten, monomeric and/or polymeric form.

The nature and amount of carbonyl compound (b) best used is determined inter alia by the desired thickness of -add-on, the degree of polymerization of precursor (a), the chemical structure of precursor (a) and the spectrum of the source of UV rays used.

It is also possible, for example, to improve the speed and/or to adapt the absorption to a source of UV rays, to add non-carbonylic photoinitiators, sensitizers and/or certain dyes.

The choice of suitable further sensitizers, photoinitiators and/or dyes is made in a conventional manner and does not form part of the subject-matter of the present invention.

The customary auxiliaries and additives which may also be included are in particular surface-active agents to improve the flow and viscosity-regulating substances.

Precursors (a), i.e. polymers or oligomers with carboxyl-containing radicals, are prepared in a conventional manner starting in general from polycarboxylic acids and/or polycarboxylic anhydrides, polyhydroxypolycarboxylic acids, polyaminopolycarboxylic acids, preferably from tetracarboxylic acids or tetracarboxylic dianhydrides, which form the radical Q in the formula (i).

Derived from this radical Q, the end products (C) preferably have the following structural units:

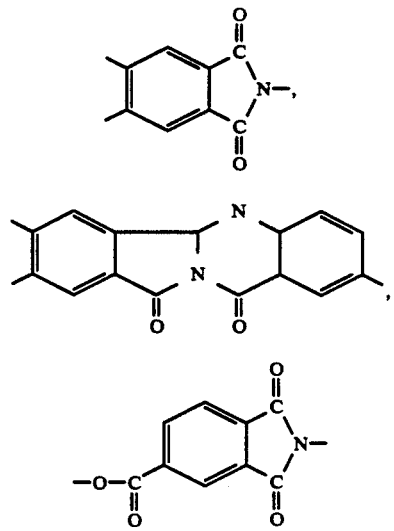

-continued

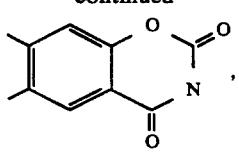

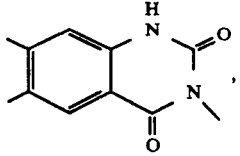

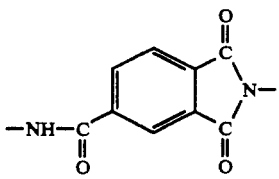

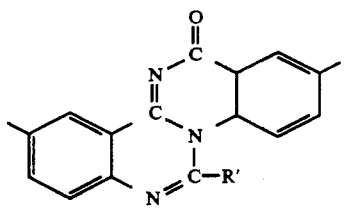

where

R¹ is alkyl of from 1 to 6 carbon atoms, isoalkyl of from 3 to 12 carbon atoms or H.

Examples of polycarboxylic acids via which the radical Q can be introduced into the formula (I) are the following acids and anhydrides thereof: 2,3,9,10-perylenetetracarboxylic acid, 1,4,5,8-naphthalenetetracarboxylic acid, 2,6-dichloronaphthalene-1,4,5,8-tetracarboxylic acid, 2,7-dichloronaphthalene-1,4,5,8-tetracarboxylic acid, phenanthrene-1,8,9,10-tetracarboxylic acid, pyromellitic acid, trimellitic acid, 3,3',4,4'-biphenyltetracarboxylic acid, 2,2',4,4'-biphenyltetracarboxylic acid, 4,4'-isopropylidenediphthalic acid, 3,3'-propylidenediphthalic acid, 4,4'-oxydiphthalic acid, 4,4'-sulfonyldiphthalic acid, 3,3'-oxydiphthalic acid, dicarboxydihydroxydiphenylmethane isomers, diaminodicarboxydiphenylmethane isomers, dicarboxydihydroxyphenyl oxide isomers, diaminodicarboxydiphenyl oxide isomers, dicarboxydihydroxydiphenyl sulfone isomers, diaminodicarboxydiphenyl sulfoxide isomers, 4,4'-methylenediphthalic acid, 4,4'-thiodiphthalic acid, 4,4'-acetylidenediphthalic acid, 2,3,6,7-naphthalenetetracarboxylic acid, 1,2,4,5-naphthalenetetracarboxylic acid, 1, 2,3,5-naphthalenetetracarboxylic acid, benzene-1, 2,3,4-tetracarboxylic acid, thiophene-2,3,4,5-tetracarboxylic acid, 1-(3',4'-dicarboxyphenyl)-1,3,3-trimethylindane-5,6-dicarboxylic acid, 1-(3',4'-dicarboxyphenyl)-1,3,3-trimethylindane6,7-dicarboxylic acid, pyrazine-2,3,5,6-tetracarboxylic acid, tetrahydrofurantetracarboxylic acid, 9-bromo-10-mercaptoanthracenetetracarboxylic acid, 9,10-dimercaptoanthracenedicarboxylic acid, benzophenonetetracarboxylic acid and also substitution products of these polycarboxylic acids, in particular halogen and/or alkyl substitution products.

To introduce the radicals R³ into the preliminary products (a), the starting materials are in general dismines or diisocyanates.

Suitable dismines are for example 4,4'-diaminodiphenyl ether, 4,4'-methylenebis(o-chloroaniline), 3,3'-dichlorobenzidine, 3,3'-sulfonyldianiline, 4,4'-diaminobenzophenone, 1, 5-diaminonaphthalene, bis(4-aminophenyl) dimethylsilane, bis(4-aminophenyl)-diethylsilane, bis(4-aminophenyl)diphenylsilane, bis(4-aminophenyloxy)-dimethylsilane, bis(4-aminophenyl)ethylphosphine oxide, N-(bis(4-aminophenyl))-N-methylamine, N-(bis(4-aminophenyl) )-N-phenylamine, 4,4'-methylenebis(3-methylaniline), 4,4'-methylenebis(2-ethylaniline), 4,4'-methylenebis(2methoxyaniline), 5,5'-methylenebis(2-aminophenol), 4,4'-methylenebis(2-methylaniline), 5,5'-oxybis(2-aminophenol), 4,4'-thiobis(2-methylaniline), 4,4'-thiobis(2-methoxyaniline), 4,4'-thiobis(2-chloroaniline), 4,4'-sulfonylbis(2-ethoxyaniline), 4,4'-sulfonylbis(2-chloroaniline), 5,5'-sulfonylbis(2-aminophenol), 3,3'-dimethyl4,4'-diaminobenzophenone, 3,3'-dimethoxy-4,4'-diaminobenzophenone, 3,3'-dichloro-4,4'-diaminobenzophenone, 4,4'-diaminobiphenyl, m-phenylenediamine, p-phenylenediamine, 4,4'-methylenedianiline, 4,4'-oxydianiline, 4,4'-thiodianiline, 4,4'-sulfonyldianiline, 4,4'-isopropylidenedianiline, 3,3'-dimethylbenzidine, 3,3'-dimethoxybenzidine, 3,3'-dicarboxybenzidine and diaminotoluene.

Dismines having readily abstractable hydrogen atoms are for example diaminodicyclohexylmethane, diamino(dimethyl)dicyclohexylmethane, diamino(dimethyldiisopropyl)dicyclohexylmethane, diamino(tetraisopropyl)dicyclohexylmethane, diamino(diisopropyl)-dicyclohexylmethane, diisopropyltoluylenediamine, alkylisopropyltoluylenediamine, diaminodiisopropyldiphenylmethane, diaminodiisopropyldiphenyl oxide, diaminodiphenylpropane and the like.

The term "diamine" here should also encompass compounds which contain the structure element >N—N<, i.e. derivatives of hydrazine.

Suitable diisocyanates are for example toluylene diisocyanate, isophorone diisocyanate, diisocyanatodiphenylmethane, trimethylhexamethylene diisocyanate, hexamethylene diisocyanate, dicyclohexylmethane diisocyanate and the dimers of these isocyanates formed via uretdione groups, and also monomeric, oligomeric and/or polymeric diisocyanates obtained from the reaction of the compounds which are bifunctional toward isocyanate groups, e.g. dismines or diols, with diisocyanates.

In these cases, the readily abstractable hydrogen atoms may also be present in the bifunctional compounds. For instance, according to the invention precursor (a) can be constructed from the reaction product of 4,4'-methylenebis(2,6-diisopropylaniline) with an equivalent excess of diisocyanatodiphenylmethane, it being a matter of conventional technique to determine the length of the molecule between monomeric and polymeric substances by the size of the excess of diisocyanate.

The starting materials mentioned are known or can be prepared in a manner known per se.

The readily abstractable hydrogen atoms are present according to the invention in the structural elements Q and/or R³, i.e. in the polymer main chain, of the general formula (I).

It is also possible to introduce in addition structural members $R^2$ and/or $R^1$, which are likewise capable of ready release of hydrogen atoms.

Preference is given to forming those precursors (a) which on conversion into the final state (C) show high heat resistance.

The polymeric precursors (a) are in general advantageously prepared in suitable organic solvents, i.e. in particular in formamide, acetamide, N-methylformamide, N,N-dimethylformamide, N-methylpyrrolidone, N,N-dimethylacetamide, butyrolactone, caprolactam, hexamethylphosphoramide and the like.

The precursors (a) according to the invention are preferably prepared by the method described under 2.

By this method, aromatic and/or heterocyclic tetracarboxylic anhydrides are reacted with diamino compounds and/or diamino compounds having at least one ortho-disposed amido group or aromatic and/or heterocyclic dihydroxydicarboxylic acids and/or diaminodicarboxylic acids with diisocyanates to give carboxyl-containing polyaddition products.

In the course of this method, readily abstractable hydrogen atoms may be present not only in the tetracarboxylic anhydrides, dihydroxydicarboxylic acids or diaminodicarboxylic acids, i.e. after the reaction in the structural member Q of the formula (I), but also in the diamino compounds and in the diisocyanates, i.e. after the reaction in the structural members $R^3$ of the formula (I).

Into these carboxyl-containing polyaddition products there may be introduced structural members $R^1$ and/or $R^2$ which likewise possess readily abstractable hydrogen atoms and/or double bonds and are light-sensitive in combination with certain carbonyl groups or photoinitiators or bisazides.

Radicals $R^1$ and/or $R^2$ of the type mentioned can be introduced for example by linking such radicals $R^1$ and/or $R^2$ as carry amino or hydroxyl groups with the carboxyl groups of the polyaddition compounds in a conventional manner of organic chemistry via amide or ester groups.

It is also possible to react such radicals $R^1$ and/or $R^2$ of the abovementioned type as carry epoxy or isocyanate groups with carboxyl-containing polyaddition products which possess readily abstractable hydrogen atoms in the polymer main chain and are light-sensitive in the presence of carbonyl compounds according to the invention and thereby to arrive at further preliminary products (a) according to the invention.

The most important use of the product according to the invention is as a photoresist by exposing through a mask, structuring with suitable solvents and then converting the structured layers at elevated temperatures into the end function layer (C).

However, there are also possibilities for use as insulating and protective layers in electrical engineering, electronics and microelectronics by using the substance according to the invention in stages (B) and (C).

The radiation-reactive composition according to the invention can also be used with advantage as a coating on optical fibers.

The invention will be further illustrated with reference to Examples.

In the Examples, parts and percentages are by weight, unless otherwise stated.

COMPARATIVE EXAMPLE 1

Preparation of a carboxyl-containing polyaddition product:

109 parts of pyromellitic anhydride (0.5 mole) and
486 parts of N-methylpyrrolidone are dissolved at 60° C. under very pure nitrogen by stirring in a reaction flask which is pressure equilibrated through a U-tube packed with drying agent.

A solution of
100 parts of diaminodiphenyl oxide (0.5 mole) in
350 parts of N-methylpyrrolidone is added through a dropping funnel in the course of an hour during which the temperature rises to 66° C. The resin solution is stirred at 75° C. for one hour and then cooled, and turns viscose.

Characterization:

Acid number (AN) : 53.2.

Viscosity: : 5750 mpas at D=100 1/s

IR spectrum : typical amide band combination at 1720, 1663, 1543, 1500 and 1240 1/cm.

This resin solution is tested with and without the addition of 2% of benzophenone (cf. Table).

EXAMPLE 1

109 parts of pyromellitic anhydride (0.5 mole) and
486 parts of N-methylpyrrolidone are dissolved at 60° C. under very pure nitrogen by stirring in a reaction flask which is pressure equilibrated through a U-tube packed with drying agent.

A solution of
147 parts of diaminodiisopropyl(biscyclohexyl)methane (0.5 mole) in
350 parts of N-methylpyrrolidone is added through a dropping funnel in the course of an hour during which the temperature rises to 66° C. The resin solution is stirred at 75° C. for one hour and then cooled, and becomes viscose.

Characterization:

AN : 49.1.

Viscosity : 1014 mpas at D=100 1/s

IR spectrum : typical amide band combination at 1720, 1663, 1543, 1500 and 1240 1/cm.

This resin solution is tested with and without the addition of 2% of benzophenone (cf. Table).

Intermediate for Example 2: (Isocyanate having radicals $R^1$)

174 parts of 214-toluylene diisocyanate (I mole=2 equivalents)

are admixed by stirring with a solution of 72 parts of tetrahydrofurfuryl alcohol (1 mole=1 equivalent)
0.1 part of dibutyltin dilaurate
0.1 part of benzoyl chloride in
127 parts of n-butyl acetate added dropwise in the course of two hours during which the temperature rises from 23° C. to 39° C. Stirring is subsequently continued at 35° C. for two hours. The result is a low-viscosity liquid having an NCO content of 10.8%.

EXAMPLE 2

200 parts of the polymer solution of Example 1 and
0.3 part of dimethylaminopyridine are rapidly admixed with 76 parts of the isocyanate having radicals $R^1$ by stirring in a glass flask with an attached bubble counter. A gas begins to evolve. Gas evolution ceases after about two hours. Stirring is then continued at 60° C. for two hours during which gas evolution initially increases again and then ceases.

Characterization:

AN : 21.

Viscosity : 938 mpas at D=100 l/s.

IR spectrum : no isocyanate bands

This resin solution is tested with and without the addition of 2% of benzophenone (cf. Table).

EXAMPLE 3

192 parts of trimellitic anhydride and 200 parts of N-methylpyrrolidone are dissolved in a stirred flask equipped with a reflux condenser and a bubble counter.

111 parts of isophorone diisocyanate are added dropwise through a dropping funnel in the course of two hours during which the temperature rises to 36° C. and a gas begins to evolve. After all the isophorone diisocyanate has been added, the contents are stirred at 70° C. for a further two hours until gas evolution ceases.

Thereafter 100 parts of diaminodiphenyl oxide dissolved in 203 parts of N-methylpyrrolidone are added in the course of an hour. The result is a brown polymer solution of low viscosity.

This polymer solution is tested with and without the addition of 2% of benzophenone (cf. Table).

EXAMPLE 4

206 parts of the polyaddition product of Example 1 are admixed in a stirred flask with a solution of 18.6 parts of tetrahydrofurfurylamine in 43.4 parts of N-methylpyrrolidone added in the course of 15 minutes during which the temperature rises to 34° C. This is followed by the addition in-the course of 30 minutes of a solution of 39.6 parts of dicyclohexylcarbodiimide in 92.4 parts of N-methylpyrrolidone during which the temperature rises to 38° C., and a precipitate forms. The contents are stirred at 60° C. for a further hour and cooled down, and the precipitate is filtered off. The result is a brownish resin solution having a viscosity of 870 mpas at D=100 S$^{-1}$.

This resin solution is tested with and without the addition of 2% of benzophenone (cf. Table).

Testing of products of the Examples and the Comparative Example.

Resin solutions of the Comparative Example and Examples 1 to 4 are knife coated as such and with 2% of benzophenone, based on the resin content, on glass plates and dried at 50° C. under reduced pressure in the course of 3 hours. Tack-free slightly brown films of 25-30 μm are obtained. These films are half covered with aluminum foil and exposed under a high-pressure mercury lamp for 15 minutes and then tested with a 1:1 mixture of ethanol/N-methylpyrrolidone as to differences in the solubility between irradiated and covered areas.

The test results are shown in the following Table:

| Resin | Benzophenone | Solubility unirradiated | irradiated |
|---|---|---|---|
| Comparative example | — | soluble | soluble |
| | + | soluble | soluble |
| Example 1 | — | soluble | soluble |

| Resin | Benzophenone | Solubility unirradiated | irradiated |
|---|---|---|---|
| | + | soluble | insoluble |
| Example 2 | — | soluble | soluble |
| | + | soluble | insoluble |
| Example 3 | — | soluble | soluble |
| | + | soluble | insoluble |
| Example 4 | — | soluble | soluble |
| | + | soluble | insoluble | soluble means: can be removed by gentle rubbing with a solvent-soaked wad of absorbent cotton.

insoluble means: only removable, if at all, with a solvent-soaked wad of absorbent cotton as a crumbly crosslinked resin following prolonged intensive rubbing.

We claim:

1. A radiation-sensitive mixture which is suitable for preparing a polyamide, a polyisoindoloquinazolinedione, a polyoxazinedione, a polyquinazolinedione or a polyquinazolone and which on irradiation with actinic light undergoes solubility differentiation, which mixture comprises (a) one or more precursors having structural elements of the general formula (I)

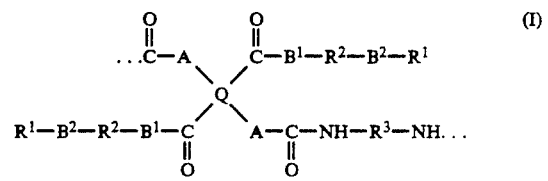

where

A is —O—, —NH— or a single bond,

Q is an unsubstituted or halogen-substituted aromatic tetravalent radical, wherein two at a time of the valences are adjacent to each other, B$^1$ is —O— or —NR$^4$—, B$^2$ is —NH—CO—NH—, —NH—CO—O—, —NH—CO— or a single bond, R$^1$ is H, alkyl, aryl, an ethylenically unsaturated radical or a readily hydrogen-donating radical selected from the group consisting of isoalkyls, aminoisoalkyls, and groups of the following general formulae:

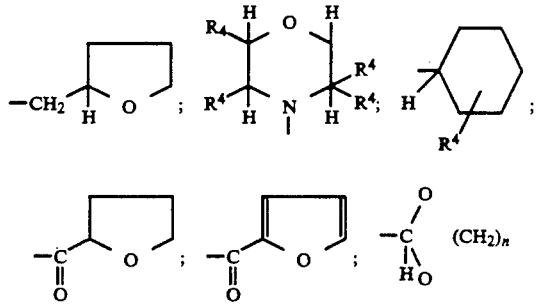

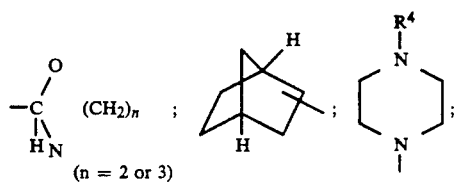

(n = 2 or 3)

-continued

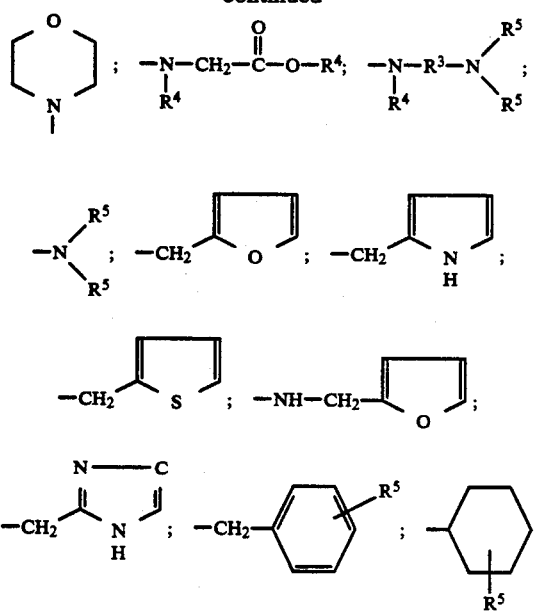

where
n is 2 or 3,
R² is a bivalent aliphatic or aromatic radical or a single bond,
R³ is a bivalent aliphatic, cycloaliphatic, aromatic radical which may be halogen-substituted,
R⁴ is H or straight-chain or branched alkyl which may be halogen-substituted, and
R⁵ is alkyl, aryl, halogen-substituted alkyl or halogen-substituted aryl,
with the proviso that at least one of Q and R³ has a readily abstractable hydrogen atom,
(b) one or more aryl-containing carbonyl compounds which when excited by UV radiation are capable of hydrogen abstraction, and optionally
(c) one or more substances selected from the group consisting of a photoinitiator, a photosensitizer, a (leuco)dye and an aliphatic ketone.

2. A radiation-sensitive mixture as claimed in claim 1, wherein the aryl-containing carbonyl compound (b) used comprises one or more aromatic ketones from the group consisting of benzophenone, xanthone, thioxanthone, fluorenone, benzil, acenaphthenequinone, tetralone, benzylideneacetone, dibenzylideneacetophenone, benzoin, benzoin ether, benzanilide, acetophenone, propiophenone, naphthoquinone, anthraquinone, anthrone, 2-, 3- and 4-hydroxybenzophenone, benzophenone-2-carboxylic acid, benzophenone-3-carboxylic acid, benzophenone-4-carboxylic acid, 3,3',4,4'-benzophenonetetracarboxylic acid and anhydride, 3,3',4,4'-tetra(tert.-butylperoxycarbonyl)benzophinone, 2-, 3-, and 4-phenylbenzophenone, 2-, 3- and 4-alkylbenzophenones having from 1 to 10 carbon atoms in the alkyl radical, halogenated (monoalkyl)benzophenone and 4-(trifluoromethyl)benzophenone.

3. A radiation-sensitive mixture as claimed in claim 1, wherein carbonyl compound (b) is used in an amount of from 0.001 to 200% by weight, based on precursor (a).

4. A radiation-sensitive mixture as claimed in claim 1, wherein carbonyl compound (b) is used in a solid, form.

5. A radiation-sensitive mixture as claimed in claim 1, wherein to improve the speed or to match the absorption to a source of UV rays a non-carbonylic photoinitiator or certain dyes are additionally added.

6. A radiation-sensitive mixture as claimed in claim 1, wherein precursor (a) is a precursor for a polyamide, for a polyoxindoloquinazolinedione, for a polyoxazinedione or for a polyquinazolinedione.

7. A radiation-sensitive mixture as claimed in claim 1, wherein precursor (a) has been obtained by linking a carboxyl-containing polyaddition product of an aromatic or heterocyclic tetracarboxylic anhydride and a diamino compound at the carboxyl groups to radicals R¹ via an ester, ether, amide or urethane group.

8. A radiation-sensitive mixture as claimed in claim 1, wherein precursor (a) has been obtained by linking a carboxyl-containing polyaddition product of an aromatic or heterocyclic dihydroxydicarboxylic acid and diisocyanate at the carboxyl groups to radicals R¹ via an ester, ether, amide or urethane group.

9. A radiation-sensitive mixture as claimed in claim 1, wherein precursor (a) has been obtained by linking a carboxyl-containing polyaddition product of an aromatic or heterocyclic diaminodicarboxylic acid and a diisocyanate at the carboxyl groups to radicals R¹ via an ester, ether, amide or urethane group.

10. A radiation-sensitive mixture as claimed in claim 1, wherein precursor (a) is not exclusively crosslinkable via the radicals R¹ but contains further radiation-sensitive radicals, in particular radicals having ethylenic double bonds or other radicals which crosslink with bisazides.

11. A radiation-sensitive mixture as claimed in claim 1, wherein the radical Q of the general formula (I) is a carboxyl radical of an acid selected from the group consisting of 2,3,9,10-perylenetetracarboxylic acid, 1,4,5,8-naphthalenetetracarboxylic acid, 2,6-dichloronaphthalene-1,4,5,8-tetracarboxylic acid, 2,7-dichloronaphthalene-1,4,5,8-tetracarboxylic acid, phenanthrene1,8,9,10-tetracarboxylic acid, pyromellitic acid, 3,3',4,4'-biphenyltetracarboxylic acid, 2,2',4,4'-biphenyltetracarboxylic acid, 4,4'-isopropylidenediphthalic acid, 3,3'-propylidenediphthalic acid, 4,4'-oxydiphthalic acid, 4,4'-sulfonyldiphthalic acid, 3,3'-oxydiphthalic acid, dicarboxydihydroxydiphenylmethane isomers, diaminodicarboxydiphenylmethane isomers, dicarboxydihydroxydiphenyl oxide isomers, diaminodicarboxydiphenyl oxide isomers, dicarboxydihydroxydiphenyl sulfone isomers, diaminodicarboxydiphenyl sulfoxide isomers, 4,4'-methylenediphthalic acid, 4,4'-thiodiphthalic acid, 4,4'-acetylidenediphthalic acid, 2,3,6,7-naphthalenetetracarboxylic 1,2,3,5-naphthalenetetracarboxylicacid, benzene-1,2,3,4-tetracarboxylic acid, thiophene-2,3,4,5-tetracarboxylic acid, 1-(3',4'-dicarboxyphenyl)-1,3,3-trimethylindane-5,6-dicarboxylic acid, 1-(3',4'-dicarboxyphenyl)-1,3,3-trimethylindane-6,7-dicarboxylic acid, pyrazine-2,3,5,6-tetracarboxylic acid, tetrahydrofurantetracarboxylic acid, 9-bromo-10-mercaptoanthracenetetracarboxylic acid, 9, 10-dimercaptoanthracenedicarboxylic acid, benzophenone acid and halogen and lower alkyl substitution products of these acids.

12. A radiation-sensitive mixture as claimed in claim 1, wherein precursor (a) has been functionalized not with just one type of radicals R¹ but with a combination of different radicals R¹.

13. A radiation-sensitive mixture as claimed in claim 1, wherein the radicals R³ are derived from diaminodicyclohexylmethane, diamino(dimethyl)dicyclohexylmethane, diamino(dimethyldiisopropyl)dicyclohexylmethane, diamino(tetraisopropyl)dicyclohexylmethane, diamino(diisopropyl)dicyclohexylmethane, diisopropyltoluylenediamine, alkylisopropyltoluylenediamine, diaminodiisopropyldiphenylmethane, diaminodiisopropyldiphenyl oxide and/or diaminodiphenylpropane, which are bonded to the main chain of precursor (a) via their amino groups.

14. A radiation-sensitive mixture as claimed in claim 1, wherein there are in addition present such radicals $R^2$ and $R^1$ as are likewise capable of ready abstraction of hydrogen atoms.

15. A radiation-sensitive mixture of claim 1, wherein carbonyl compound (b) is in dissolved form.

16. A radiation-sensitive mixture of claim 1, wherein carbonyl compound (b) is in dispersed form.

17. A radiation-sensitive mixture of claim 1, wherein carbonyl compound (b) is in molten form.

18. A radiation-sensitive mixtures of claim 1, wherein carbonyl compound (b) is in monomeric form.

19. A radiation-sensitive mixture of claim 1, wherein carbonyl compound (b) is in polymeric form.

20. A radiation-sensitive mixture of claim 1, wherein the carbonyl compound (b) is selected from the group consisting of heteroceriumdianthrone; the endoperoxide of heteroceriumdianthrone; 2-acetonaphthone; 4-aminobenzophenone; 4,4-tetramethylaminobenzophenone; and the salts of these amines.

21. A radiation-sensitive mixture of claim 20 which additionally contains aliphatic ketones selected from the group consisting of acetone, methylisobutyl ketone, and isoamyl ketone.

* * * * *

UNITED STATES PATENT AND TRADEMARK OFFICE
CERTIFICATE OF CORRECTION

PATENT NO.: 5,284,734

DATED: February 8, 1994

INVENTOR(S): BLUM et al.

It is certified that error appears in the above-identified patent and that said Letters Patent is hereby corrected as shown below:

Column 21, claim 2, line 57, "benzophinone" should be --benzophenone--.

Column 22, claim 11, line 50, after "2,3,6,7-naphthalenetetracarboxylic" insert --acid--.

Column 22, claim 11, line 50, before "1,2,3,5-naph-" insert --1,2,4,5-naphthalenetetracarboxylic acid--.

Column 22, claim 11, line 59, after "benzophenone" insert --tetracarboxylic acid--.

Signed and Sealed this

Fourth Day of October, 1994

Attest:

BRUCE LEHMAN

Attesting Officer

Commissioner of Patents and Trademarks